(12) United States Patent
Nakanishi et al.

(10) Patent No.: US 7,250,375 B2
(45) Date of Patent: Jul. 31, 2007

(54) SUBSTRATE PROCESSING METHOD AND MATERIAL FOR ELECTRONIC DEVICE

(75) Inventors: Toshio Nakanishi, Amagasaki (JP); Takuya Sugawara, Nirasaki (JP); Seiji Matsuyama, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/485,410

(22) PCT Filed: Aug. 2, 2002

(86) PCT No.: PCT/JP02/07927

§ 371 (c)(1),
(2), (4) Date: Jan. 30, 2004

(87) PCT Pub. No.: WO03/015151

PCT Pub. Date: Feb. 20, 2003

(65) Prior Publication Data

US 2004/0235311 A1 Nov. 25, 2004

(30) Foreign Application Priority Data

Aug. 2, 2001 (JP) .............................. 2001-235627

(51) Int. Cl.
*H01L 21/31* (2006.01)
*H01L 21/461* (2006.01)
*H01L 29/76* (2006.01)

(52) U.S. Cl. .................. 438/775; 438/776; 438/769; 438/765; 257/309; 257/314; 257/64; 257/E21.193

(58) Field of Classification Search ................ 438/775, 438/287, 183, 591, 769, 777, 776; 257/315, 257/314, 318, 321, 309, 64, E21.193
See application file for complete search history.

(56) References Cited

U.S. PATENT DOCUMENTS

| 4,298,629 | A | * | 11/1981 | Nozaki et al. | ............... | 438/776 |
| 5,189,504 | A | * | 2/1993 | Nakayama et al. | ......... | 257/422 |
| 5,521,127 | A | * | 5/1996 | Hori | ........................... | 438/770 |
| 6,136,690 | A | * | 10/2000 | Li | ............................... | 438/627 |
| 6,200,893 | B1 | * | 3/2001 | Sneh | ........................ | 438/685 |
| 6,300,664 | B1 | * | 10/2001 | Kuroi et al. | ................ | 257/410 |

(Continued)

FOREIGN PATENT DOCUMENTS

JP            60-241269           11/1985

(Continued)

*Primary Examiner*—B. William Baumeister
*Assistant Examiner*—Igwe U. Anya
(74) *Attorney, Agent, or Firm*—Crowell & Moring LLP

(57) ABSTRACT

A method of processing a for an electronic device, comprising, at least: a nitridation step (a) of supplying nitrogen radicals on the surface of the electronic device substrate, to thereby form a nitride film on the surface thereof; and a hydrogenation step (b) of supplying hydrogen radicals to the surface of the electronic device substrate. By use of this method, it is possible to recover the degradation in the electric property of an insulating film due to a turnaround phenomenon which can occur at the time of nitriding an Si substrate, etc.

51 Claims, 9 Drawing Sheets

U.S. PATENT DOCUMENTS

| | | | |
|---|---|---|---|
| 6,338,991 B1 * | 1/2002 | Zhang et al. | 438/162 |
| 6,372,084 B2 * | 4/2002 | Hongo et al. | 156/345.1 |
| 6,450,116 B1 * | 9/2002 | Noble et al. | 118/723 R |
| 6,497,783 B1 * | 12/2002 | Suzuki et al. | 156/345.34 |
| 6,551,948 B2 * | 4/2003 | Ohmi et al. | 438/778 |
| 6,566,205 B1 * | 5/2003 | Yu et al. | 438/287 |
| 6,750,157 B1 * | 6/2004 | Fastow et al. | 438/786 |
| 6,756,635 B2 * | 6/2004 | Yasuda et al. | 257/325 |
| 2002/0073925 A1 * | 6/2002 | Noble et al. | 118/723 OME |
| 2003/0157771 A1 * | 8/2003 | Luoh et al. | 438/287 |
| 2003/0181012 A1 * | 9/2003 | Wang et al. | 438/287 |
| 2003/0232491 A1 * | 12/2003 | Yamaguchi | 438/591 |
| 2004/0119111 A1 * | 6/2004 | Omi et al. | 257/315 |

FOREIGN PATENT DOCUMENTS

| | | | |
|---|---|---|---|
| JP | 3-212938 | | 9/1991 |
| JP | 03212938 A | * | 9/1991 |
| JP | 4-245635 | | 9/1992 |
| JP | 7-193059 | | 7/1995 |
| JP | 2000-114541 | | 4/2000 |
| JP | 2002-110975 | | 4/2002 |
| JP | 2002-208593 | | 7/2002 |

* cited by examiner

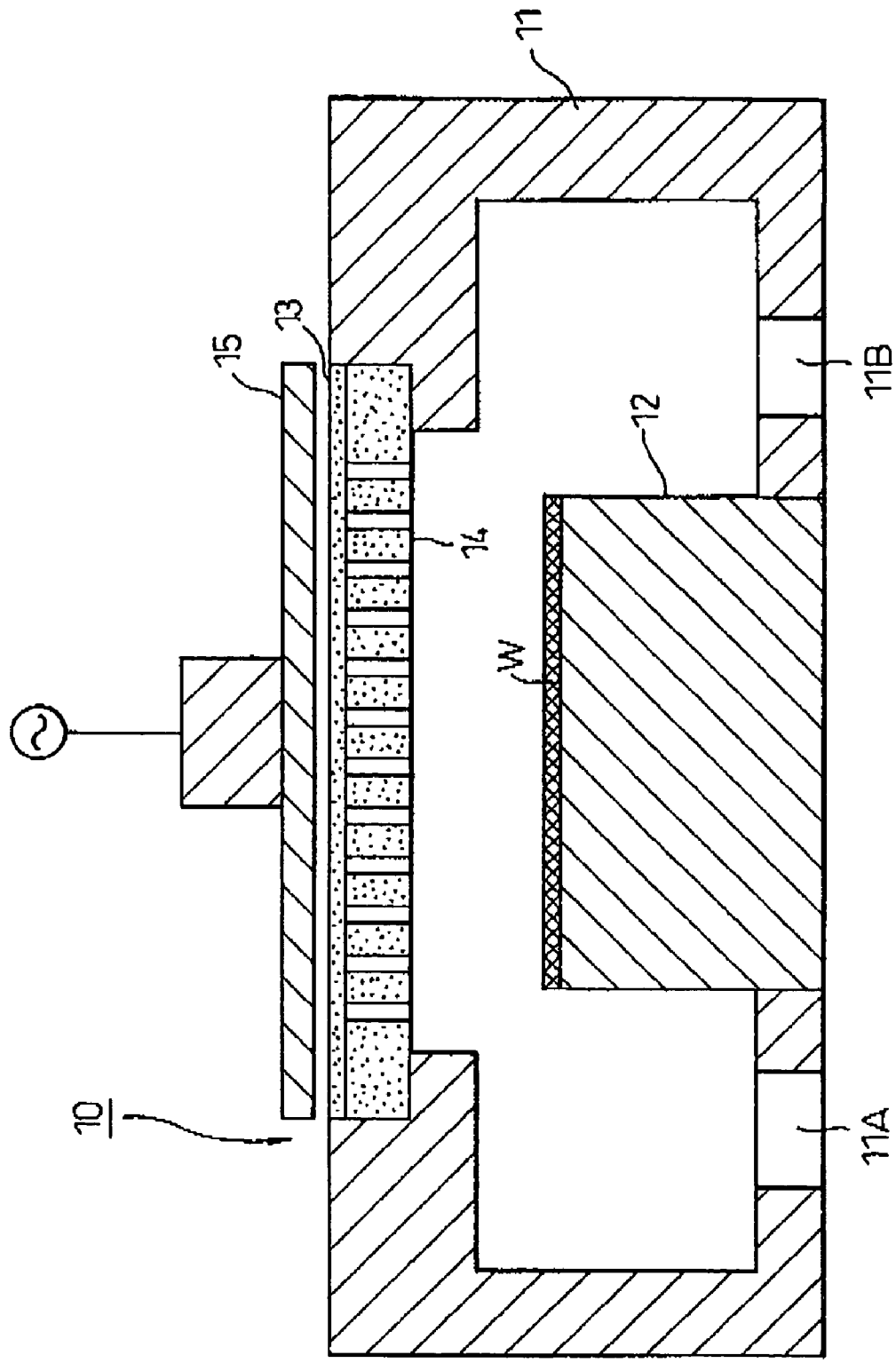

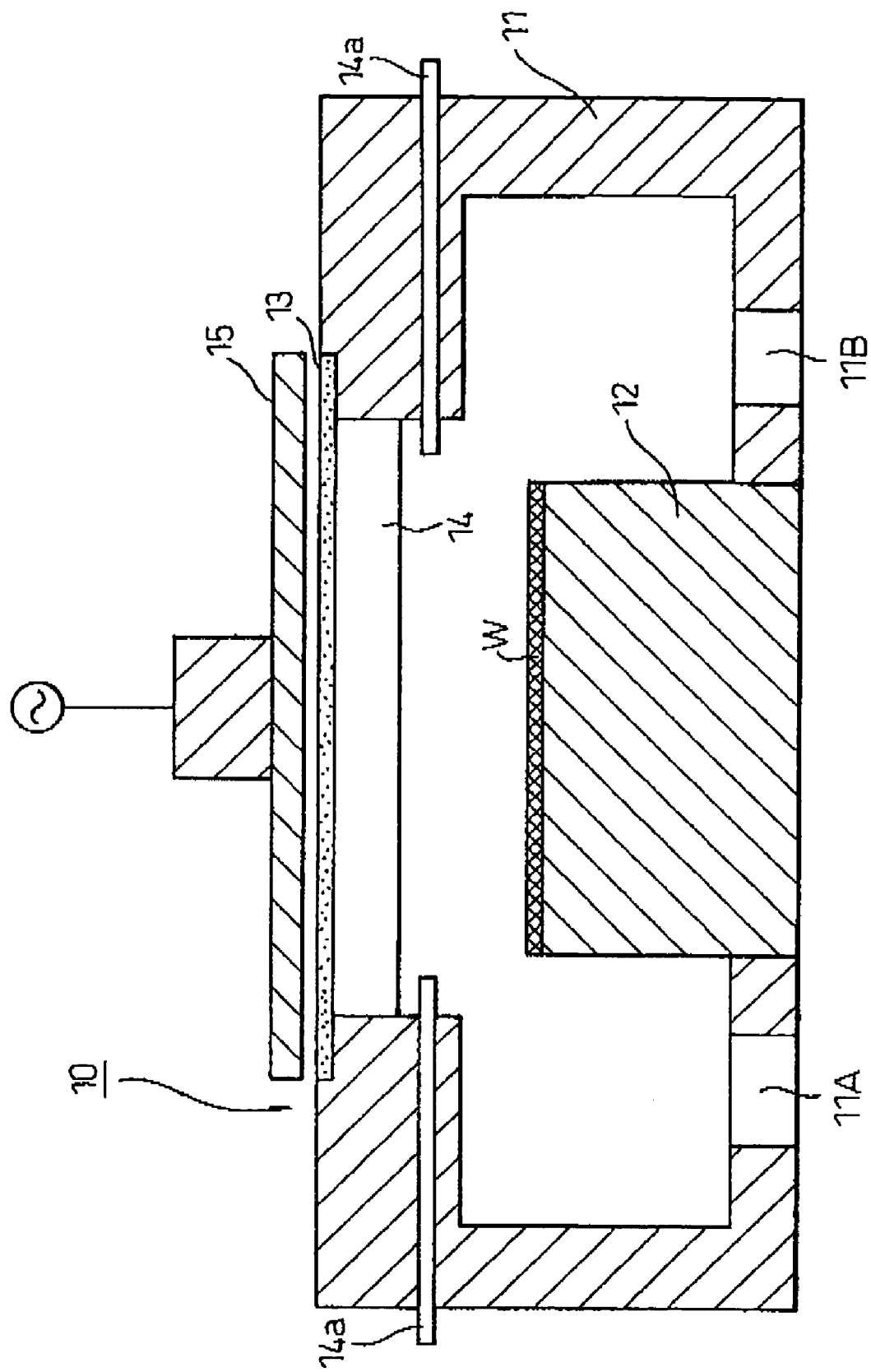

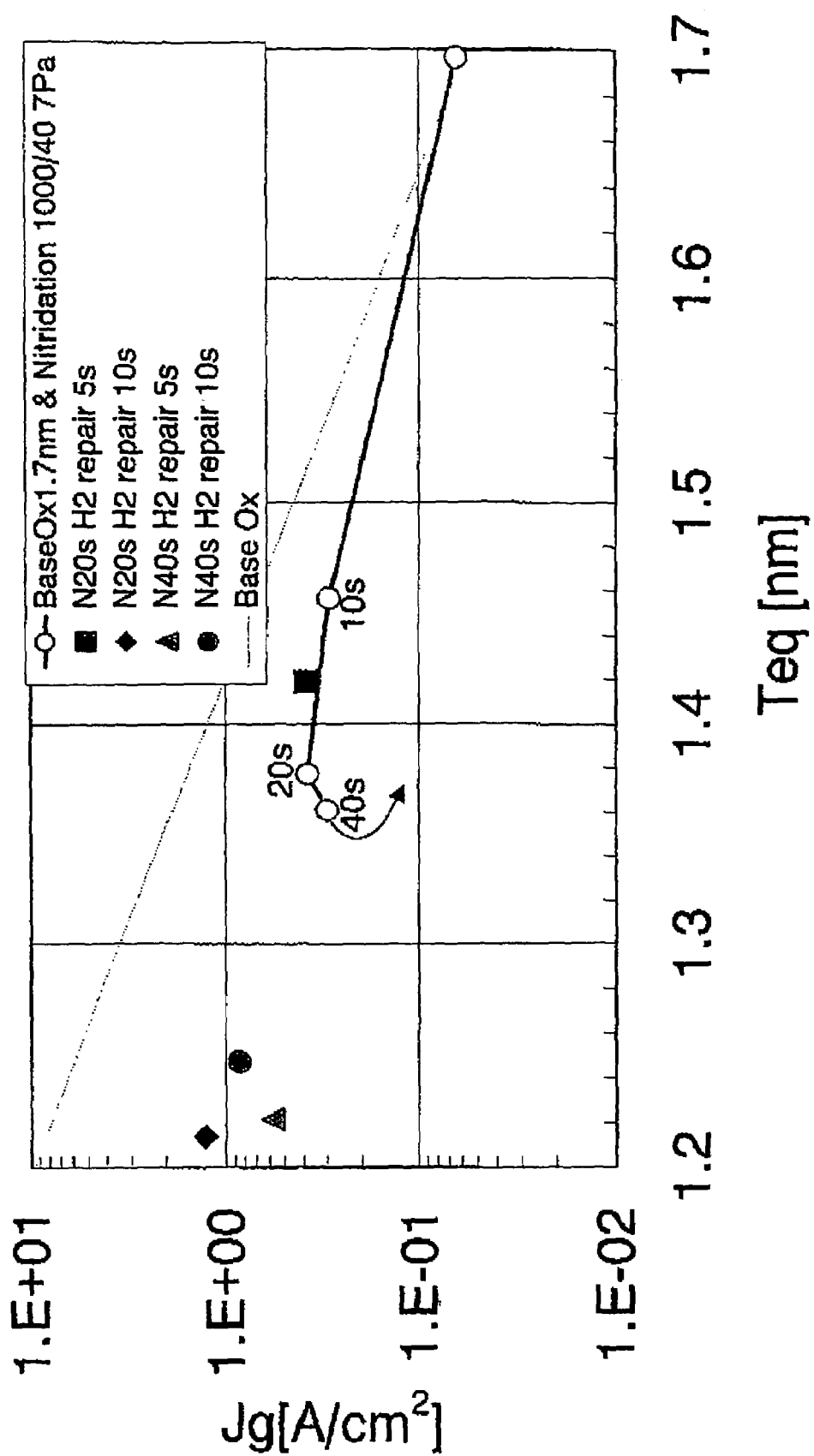

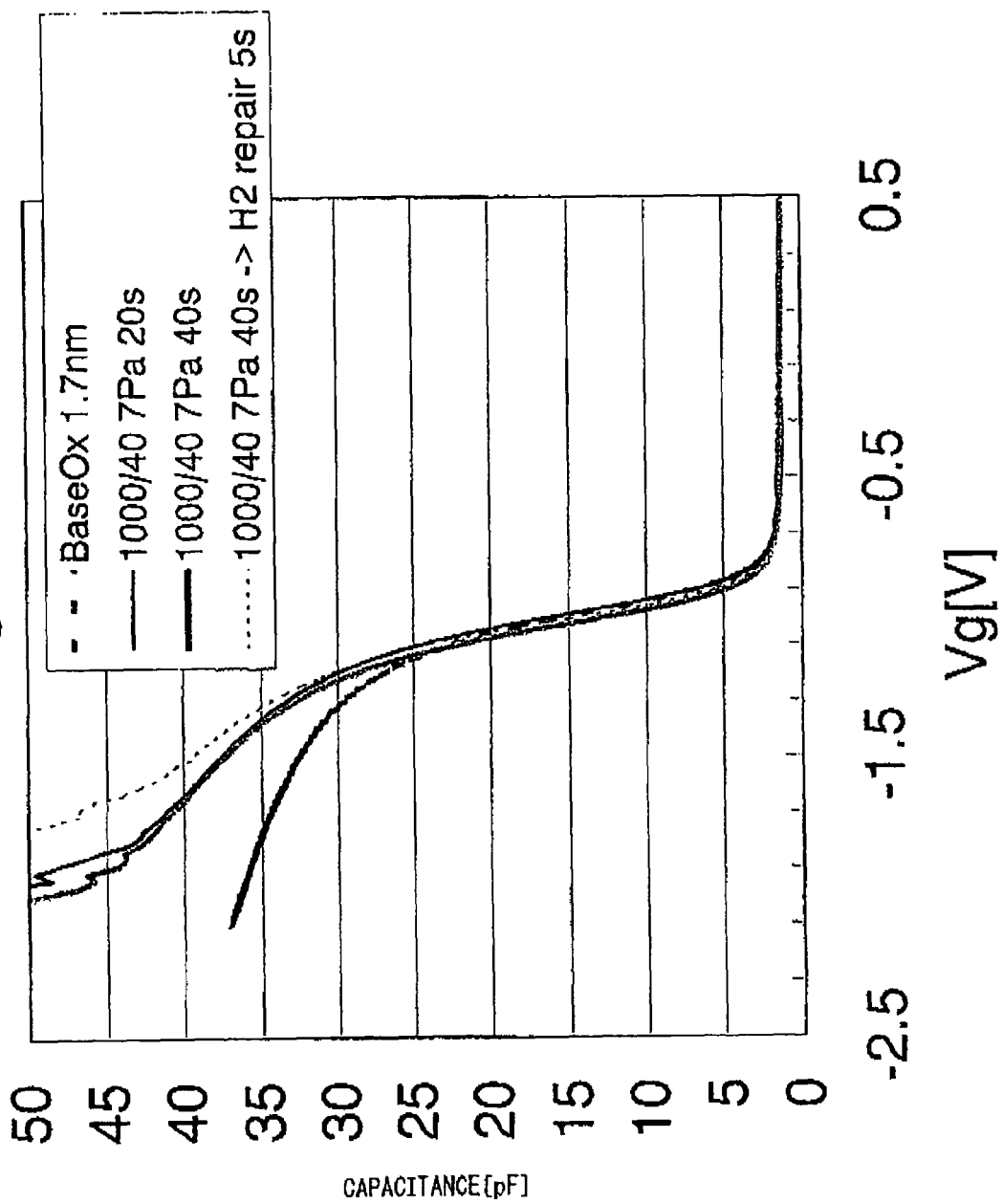

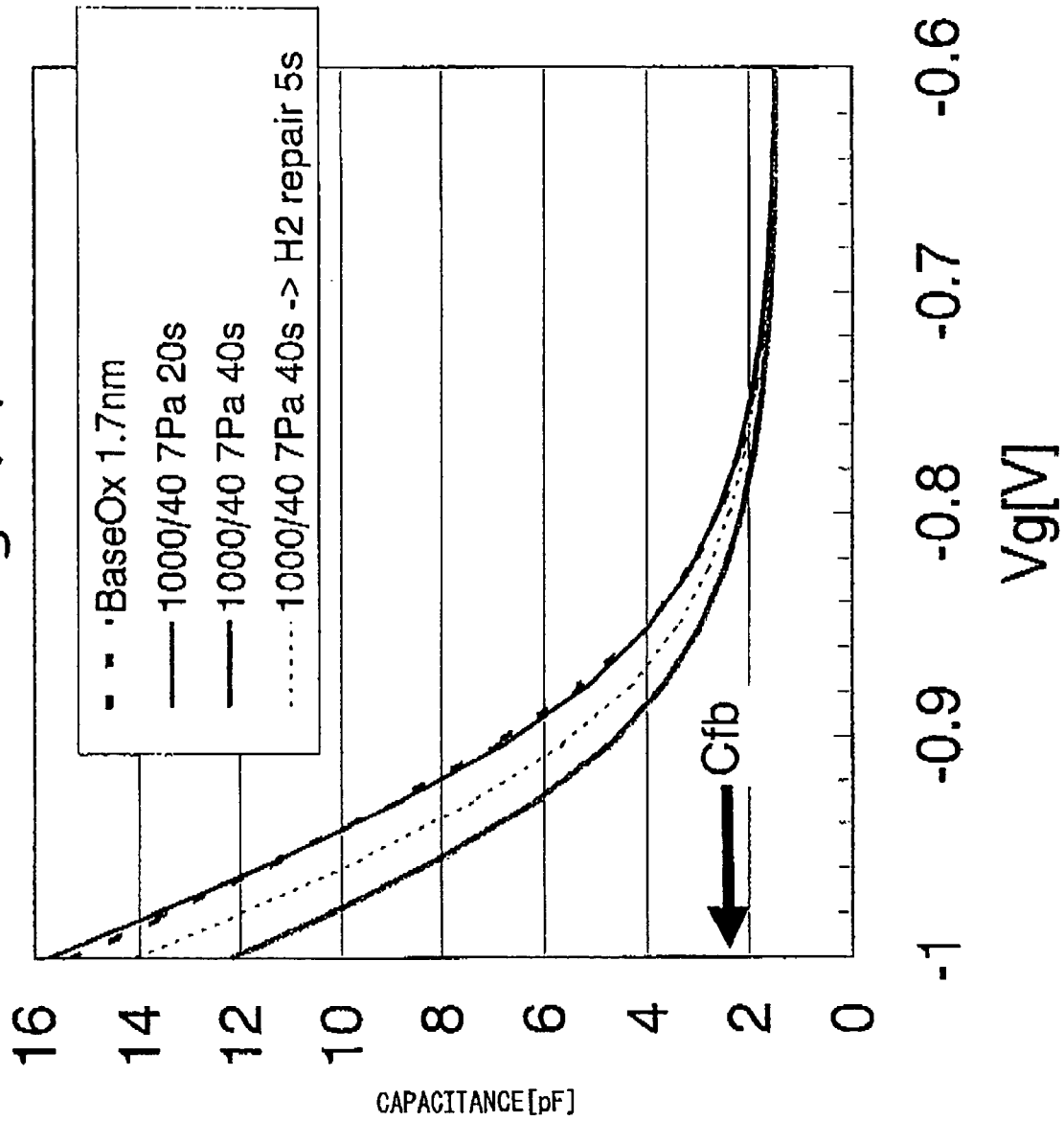

SUBSTRATE PROCESSING METHOD AND MATERIAL FOR ELECTRONIC DEVICE

TECHNICAL FIELD

The present invention relates to a method of processing a substrate for electronic device by supplying nitrogen radicals, etc., to the electronic device substrate, and a material for an electronic device having a high-quality nitride film. The substrate-processing method according to the present invention may particularly suitably be used, e.g., for forming a high-dielectric film on an electronic device substrate.

BACKGROUND ART

In general, the present invention is widely applicable to the production of materials for electronic device such as semiconductors or semiconductor devices, and liquid crystal devices. For the convenience of explanation, however, the background art relating to semiconductor devices as an example of the electronic devices, will be described here.

Substrates for semiconductors or electronic device materials such as silicon have been subjected to various kinds of treatments such as formation of an insulating film such as oxide film, film formation by CVD (chemical vapor deposition), etc., and etching.

It is not too much to say that the development in the performances of semiconductor devices in recent years is attributable to the microfabrication technique concerning the semiconductor devices such transistor. At present, the microfabrication technique concerning the semiconductor devices is being improved for the purpose of attaining further development in the performances of semiconductor devices. According to the recent requirement for forming microstructures and attaining further development in the performances in the field of semiconductor devices, the demand for an insulating film having a higher performance (for example, in view of leakage current) has been increased remarkably. This is because the leakage current of a certain degree can cause a severe problem in the recent devices which have attained finer structure, and/or higher performances, even when the leakage current of such a degree have actually caused substantially no problem in the conventional devices having a lower degree of integration. Particularly, in view of the development in the mobile or portable-type electronic devices in a so-called "ubiquitous" society of recent construction (i.e., information-oriented society wherein people can use a network service, anytime and anywhere, by means of electronic devices), the reduction in the leakage current is an extremely important issue.

For example, with respect to the development of a next-generation MOS transistor, as the above-mentioned microfabrication technique is advanced, the film-thinning of a gate insulator have approached a limit thereof, and a serious problem to be overcome is brought into view. More specifically, in view of processing technique, it is possible to thin the film thickness of a silicon oxide ($Sio_2$) film which has been used as a gate insulator, to the utmost limit thereof (i.e., a level corresponding to one or two atom-layer). However, when film thickness is reduced to 2 nm or less, an exponential increase in the leakage current is caused by the direct tunneling due to quantum effect, whereby the resultant power consumption is problematically increased.

At present, the IT (information technology) market is going to be transformed from the stationary-type electronic devices represented by desktop type personal computers or home telephones (i.e., devices supplied with electricity from a plug socket) into "ubiquitous network society" wherein people can access the Internet anywhere and anytime. Accordingly, it is considered that mobile terminals such as cellular phone or car navigation system will become predominant in the near future. Such mobile terminals, per se is required to be a high-performance device. In addition, they should satisfy a prerequisite that they are small-sized, light in weight, and have a function capable of being used for a long time, although these performances are not necessarily required for the stationary-type devices. Accordingly, in the field of a mobile terminal, it is an extremely important issue to accomplish the reduction in power consumption and to accomplish the above-mentioned high performances simultaneously.

Typically, for example, with respect to the development of the above-mentioned next-generation MOS transistor, when the microfabrication of a high-performance silicon LSI is investigated, there occurs a problem that the leakage current is increased and the resultant power consumption is also increased. Accordingly, in order to accomplish a higher performance while reducing the power consumption, it is necessary that the performance of an MOS transistor is enhanced without increasing the gate leakage current therein.

With respect to the above-mentioned microfabrication, due to the development in the microfabrication technique, at present, it is nearly possible to produce a super-microfabricated semiconductor device (such as MOS transistor) having a gate length of 0.1 μm or less.

In such a super-microfabricated semiconductor device when the working speed of a semiconductor device is intended to be increased along with the shortening of the gate length, it is necessary to reduce the thickness of gate insulator in accordance with the scaling law. For example, when a conventional thermal oxidation film is used as the gate insulator, it is necessary to reduce the thickness of the gate insulator to about 1.7 nm or less, for example. However, when the thickness of the conventional oxide film is reduced in this way, the gate leakage current flowing through the oxide film is increased due to the above-mentioned tunnel effect.

For the above reason, heretofore, it has been investigated to use a high-dielectric film such as $Ta_2O_5$ or $ZrO_2$ as the gate insulator, instead of the conventional silicon oxide film. However, various properties of the high-dielectric film such as $Ta_2O_5$ or $ZrO_2$ are quite different from those of the silicon oxide film which has heretofore been used in the semiconductor technology. Accordingly, there remain a lot of problems to be solved, before such a high-dielectric film can actually be used as the gate insulator.

As a measure for solving such problems, it has been investigated to use a nitride film (and/or oxynitride film) as the gate insulator material. For example, the silicon nitride is the material which has been used in the conventional semiconductor processes. In addition, the silicon nitride has a relative dielectric constant which is about twice that the silicon oxide film, and is promising as the gate insulator for of the next-generation high-speed semiconductor devices.

Heretofore, it has been usual that the silicon nitride film is formed on an interlayer dielectric (or interlayer insulating film) by using a plasma-CVD method. However, such a CVD nitride film generally provides a large leakage current and also has a large absolute value of vfb (flat band voltage), and therefore it is not suitable for the gate insulator. For this reason, it has never been attempted to use the nitride film as the insulating film constituting a gate electrode.

On the other hand, there has recently been proposed a technique that a nitrogen-containing gas such as nitrogen gas, nitrogen gas and hydrogen gas, or $NH_3$ gas is introduced into a microwave-excited inert gas plasma such as argon or krypton, so as to generate an nitrogen radicals or NH radicals (however, the NH radicals are liable to provide dangling bonds), whereby the surface of a silicon oxide film is converted into a nitride film. The thus formed nitride film may provide a leakage current characteristic which is comparable to, or even superior to that of a thermal oxidation film, and is promising as the gate insulator of the next-generation high-speed semiconductor devices. In addition, there has been proposed a technique that the surface of a substrate for electronic device is directly nitrided by such microwave plasma.

However, in the prior art, e.g., when the surface of a silicon oxide film formed on a substrate for semiconductor is modified or transformed by microwave-excited hydrogen nitride radicals NH*, there occurs a degradation in the resultant electric properties (for example, an increase in the absolute value of Vfb, a change in threshold voltage), and a desired transistor characteristic has never been not accomplished.

DISCLOSURE OF INVENTION

An object of the present invention is to provide a substrate processing method and a material for an electronic device, which can solve the above-mentioned problem encountered in the prior art.

An object of the present invention is to provide a substrate processing method and a material for an electronic device, which can provide a good device characteristic while avoiding the degradation of an electric characteristic, when a nitride film is formed on the surface of a substrate for electronic device (comprising, e.g., a silicon surface or an oxide film surface) by a plasma nitriding process.

As a result of earnest study, the present inventors have found that it is extremely effective for solving the above problem to supply nitrogen radicals and hydrogen radicals in parallel at least partially, and/or to supply nitrogen radicals and hydrogen radicals sequentially one after another, on to the surface of a substrate for an electronic device, instead of supplying NH radicals thereonto as in the prior art.

The substrate processing method according to the present invention is based on the above discovery, and comprises: at least, a nitridation step (a) of supplying nitrogen radicals on the surface of the electronic device substrate, to thereby form a nitride film on the surface thereof; and a hydrogenation step (b) of supplying hydrogen radicals to the surface of the electronic device substrate.

The substrate processing method according to the present invention can provide a good characteristic relating to electric property such as flat band voltage, According to the present inventors, investigations and knowledge, it is presumed that, when nitrogen radicals and hydrogen radicals are supplied in parallel at least partially, and/or nitrogen radicals and hydrogen radicals are supplied sequentially one after another, onto the surface of a substrate for an electronic device, the hydrogen radicals arrive at the interface or boundary between the raw material (for example, silicon) and the nitride film which has been formed thereon, to thereby terminate defects such as dangling bonds of the interface region of such a nitride film, etc. In addition, it is presumed that the effective oxide thickness (EOT) of the resultant insulating film to be formed can also be reduced by terminating the defects such as dangling bonds of such an interface region, etc.

In the present invention, for example, as a result of the nitridation of the oxide film by a nitrogen radicals, a so-called turnaround phenomenon may occur in some cases. This phenomenon is that, at first, as the surface of the silicon oxide film is converted into a silicon nitride film, the electric oxide film the thickness (i.e., effective oxide thickness) of the entire film is decreased, and the value of the leakage current is also decreased as compared with that of a silicon oxide film having the same effective oxide thickness; but after a certain point in time, the effective oxide thickness of the entire film is reversely increased. According to the present inventors' investigations and knowledge, this phenomenon may presumably be attributable to a phenomenon that the nitrogen arrives at the interface between the silicon oxide film and the silicon so s to nitride the electronic device substrate, whereby the physical film thickness of the entire insulating film is increased.

In the present invention, it has been observed a phenomenon such that even when the Si surface is nitrided by such turnaround, the electric property such as flat band voltage is recovered by conducting hydrogen radical treatment. According to the present inventors,' investigations and knowledge, this may presumably be attributable to a phenomenon that the hydrogen radicals arrive at the interface between the silicon and the nitride film, to thereby terminate defects such as dangling bonds of the interface region of such a nitride film, etc. In addition, it is presumed that the effective oxide thickness of the resultant insulating film to be formed can also be reduced by terminating the defects such as dangling bonds, etc., in the interface region between the silicon and the nitride film.

On the other hand, in the prior art, when the surface of a silicon oxide film formed on a silicon substrate is modified or transformed by microwave-excited hydrogen nitride radicals NH*, there occurs a turnaround phenomenon as described above, In the prior art, when the silicon substrate is nistrided, the flat band voltage of a MOS transistor is changed, and therefore the threshold voltage is changed, whereby a desired transistor characteristic is not provided.

BRIEF DESCRIPTION OF DRAWINGS

FIG. 1 is schematic sectional view showing an example of the structure or configuration of the substrate processing apparatus which is usable for carrying out the method according to the present invention.

FIG. 2 is a schematic sectional view showing another example of the structure or configuration of the substrate processing apparatus which is usable for carrying out the method according to the present invention.

FIG. 5 is a graph showing leakage current characteristic Jg and the effective oxide thickness Teq of an insulating film which has been provided by the first embodiment of the present invention.

FIG. 7A and FIG. 7B are graphs showing C-V characteristics which have been provided by the first embodiment of the present invention.

Figure 3A:
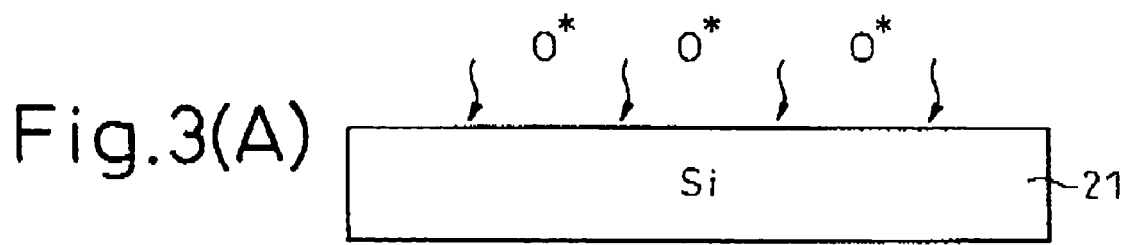
FIGS. 3A to 3D are schematic sectional views showing the substrate processing steps according to the first embodiment of the present invention.

In the above drawings, the reference numerals respectively have the following meanings.

10: substrate processing apparatus
11: processing room
12: substrate-holding base
13: cover plate
14: shower plates
15: antenna
21: substrate for electronic device
22: silicon oxide films
22A, 23: silicon nitride film

BEST MODE FOR CARRYING OUT THE INVENTION

Hereinbelow, the present invention will be described in detail with reference to the accompanying drawings as desired. In the following description, "%" and "part(s)" representing a quantitative proportion or ratio are those based on mass, unless otherwise specifically noted.

(Substrate Processing Method)

The substrate processing method according to the present invention comprises, at least, (a) a nitridation step of supplying nitrogen radicals onto the surface of an electronic device substrate, to thereby form a nitride film on the surface; and (b) a hydrogenation step of supplying hydrogen radicals onto the surface of the electronic device substrate.

(Nitrogen Radical-Supplying Step and Hydrogen Radical-Supplying Step)

In the present invention, it is possible to use any order or sequence in the time of the nitrogen radical-supplying step (a), and the hydrogen radical-supplying step (b), as long as it can achieve a predetermined effect (e.g., suitable flat band voltage as described hereinafter). In other words, for example, the following embodiments are possible concerning these order of the step (a) and the step (b).

(1) The step (a) is conducted, and thereafter the step (b) is conducted.

(2) The step (a) and the step (b) are conducted in parallel.

(3) The step (a) and the step (b) are conducted so that they are partially simultaneously (in other words, partially in parallel).

When the surface of an electronic device substrate to be processed by the present invention comprises an oxide film, it is preferred to adopt the above combination of (1). That is, it is preferred that the step (a) is conducted, and thereafter the step (b) is conducted. This is because, in general, an oxide film is comparatively less liable to be nitrided when the (nitrogen radicals+hydrogen radicals) are simultaneously supplied.

(Electronic Device Material)

The material for an electronic device according to the present invention is an electronic device material which comprises a substrate for an electronic device, and has a nitride film on at least a part of the surface of the electronic device substrate; wherein the electronic device material provides a shift in the flat band voltage (Vfb) of 0.1 V or less in NMOS, as compared with the flat band voltage of an oxide film, provided that the electronic device material is used as an insulating layer constituting an MOS type device structure. The shift in this Vfb in NMOS may preferably be 0.05 V or less, particularly preferably 0.03 V or less. In the case of a PMOS, the electronic device material may preferably be one providing a shift of 1 V or less. The shift in the Vfb in PMOS may preferably be 0.5 V or less, particularly preferably 0.3 V or less.

In the above-mentioned electronic device material, the phrase "the material has a nitride film on the surface thereof" means that the nitride film is in a position such that the film can be nitrided by the above-mentioned combination of the nitrogen radical-supplying step (a) and the hydrogen radical-supplying step (b) (In other words, it is not necessarily required that the nitride film is positioned on the outermost surface of the electronic device material). In addition, in the above-mentioned electronic device material, the phrase "at least one part of the surface" means that the nitride film has a size and a thickness which enable the nitride film to exhibit its function (for example, function as the gate insulator of an MOS structure).

(Embodiment of Electronic Device Material)

The electronic device material having a nitride film on at least a part of the surface thereof may constitute a part of an arbitrary electronic device (such as semiconductor device, and liquid crystal device) specific examples of such an electronic device may include the following examples.

(1) Examples of a semiconductor device: e.g., semiconductor devices having an MOS structure, more specifically, MOS type field-effect transistor or capacitor/capacity, etc.

(2) Examples of liquid crystal device: e.g., liquid crystal devices having a poly-silicon film on a glass plate, more specifically, TFT, etc.

(Flat Band Voltage)

The usage or application of the electronic device material according to the present invention is not particularly limited. The high-quality nitride film according to the present invention is particularly suitable as an insulating film of a semiconductor device (particularly, the gate insulator of an MOS semiconductor structure).

When electronic device material according to the present invention is used, it is easy to produce an MOS semiconductor structure having the above-mentioned preferred Vfb characteristic. In addition, when the characteristic of the nitride film which has been formed by the present invention is intended to be evaluated, instead of evaluating the characteristic of the nitride film per se, for example, it is also possible that a standard MOS semiconductor structure as described in a publication "Physics of VLSI Devices" written by Seigo Kishino & Mitsumasa Koyanagi, Matuzen, pp. 62–63 is formed, and the characteristic of the resultant MOS is evaluated. This is because, in such a standard MOS structure, the characteristic of the nitride film constituting the MOS structure has an important effect on the MOS characteristic.

(One Embodiment of Substrate Processing Apparatus)

FIG. 1 is a schematic sectional view showing an embodiment of the configuration or structure of a plasma substrate-processing apparatus 10 which is usable in the substrate-processing method according to the present invention.

Referring to FIG. 1, the plasma substrate-processing apparatus 10 has a processing container 11 wherein a substrate-holding base 12 for holding thereon a substrate w to be processed is disposed. The processing container 11 is evacuated by exhaust ports 11A and 11B.

On the processing container 11, an opening is formed so that the opening corresponds to the substrate w to be processed on the substrate-holding base 12, and this opening is covered with a cover plate 13 comprising a low-loss ceramic such as alumina. Further, below the cover plate 13, there is disposed a shower plate 14 comprising a low-loss ceramic such as alumina, wherein a gas introduction passage and a number of nozzle openings communicating with the gas introduction passage.

The above shower plate and cover plate 14 constitute a microwave window. On the outside of the above cover plate 14, there is disposed a microwave antenna such as radial-line slot array antenna or electric horn antenna.

In the operation of the device shown in FIG. 1 having the above constitution, the processing space in the inside of the processing container 11 is evacuated through the exhaust port 11A and 11B, so that the processing space is set to a predetermined processing pressure, and a desired process gas (such as oxygen gas, and nitrogen gas) is introduced into the processing container 11 together with an inert gas such as argon or krypton from the above shower plate 14.

Further, microwave having a frequency of several GHz is introduced into the processing container 11 from the antenna 15, so that high-density microwave plasma is excited on the surface of the substrate W to be processed. In this way, the electron temperature of the plasma can be lowered in the substrate-processing apparatus of FIG. 1 by exciting the plasma by microwave, to thereby avoid the damage or deterioration of the substrate w to be processed and the inner wall of the processing container 11. In addition, the radicals which have generated by the action of the plasma are caused to flow in the radial direction along the surface of the substrate W to be processed and rapidly discharged. Accordingly, it is easy to suppress the recombination of the radicals, and it is possible to efficiently conduct the uniform processing of the substrate, at a low temperature (for example, 550° C. or less).

(Another Embodiment)

FIG. 2 is a schematic sectional view showing another embodiment of the configuration of the plasma substrate-processing apparatus 10 which is usable in the substrate-processing method according to the present invention. The constitution of FIG. 2 is the same as the configuration of FIG. 1 except that a gas introduction port 14a is used instead of the shower plate 14 for introducing a raw material gas in the embodiment of FIG. 1.

(Constitution of Respective Portions)

Next, there are described he electronic device material, or the substrate-processing method according to the present invention, or the respective portions constituting the substrate-processing apparatus which are suitably usable for the substrate-processing method.

(Electronic Device Substrate)

The electronic device material to be usable in the present invention is not particularly limited, but may appropriately be selected from one kind or combination of at least two kinds of known electronic device materials. Examples of such an electronic device material may include: semiconductor materials, liquid crystal device materials, etc. Examples of the semiconductor material may include: materials comprising single-crystal silicon as a main component, materials comprising a metal as a main component, and materials comprising quartz as a main component.

Examples of the liquid crystal device material may include: e.g., a substrate having a poly-silicon film disposed on a glass plate.

(Process Gas for Supplying Nitrogen Radicals)

The process gas which is usable in the nitrogen radical supplying step (a) in the present invention is not particularly limited, as long as it comprises a gas which is capable of supplying nitrogen radicals onto a substrate to be processed. Such a gas to be used can appropriately be selected from one kind of known process gas, or combinations of two or more kinds of known process gas which are usable for the production of electronic devices.

Specific examples of such a process gas may include the following gases.

(1) A mixture gas comprising an inert (or rare) gas and nitrogen gas ($N_2$).

(2) A mixture gas comprising an inert gas and ammonia ($NH_3$).

(Process Gas for Supplying Hydrogen Radicals)

The process gas which is usable in the hydrogen radical-supplying step (b) in the present invention is not particularly limited, as long as it comprises a gas which is capable of supplying hydrogen radicals onto a substrate to be processed. Such a gas to be used can appropriately be selected from one kind of known process gas, or combinations of two or more kinds of known process gas which are usable for the production of electronic devices.

Specific examples of such a process gas may include the following gases.

(1) A mixture gas comprising an inert gas and hydrogen gas ($H_2$).

(2) A mixture gas comprising an inert gas and ammonia ($NH_3$).

(Inert Gas)

The inert gas to be usable in the present invention is not particularly limited, but may appropriately be selected from one kind or combination of at least two kinds of known inert gases usable for the production of electronic devices. The examples of such an inert gas may include krypton (Kr), xenon (Xe), helium (He) or argon (Ar).

(Process Gas Condition)

In the nitride film formation according to the present invention, the following conditions may suitably be used in view of the characteristic of the nitride film to be formed.

(Conditions for Nitrogen Radical-Supplying Step)

Inert gas (e.g., krypton, argon, He or Xe): 500–3000 sccm, more preferably 1000–2000 sccm, $N_2$: 10–500 sccm, more preferably 20–100 sccm, Temperature: room temperature (25° C.) to 600° C., more preferably 250–500° C., particularly preferably 250–400° C.

Pressure; 3–400 Pa, more preferably 67–270 Pa, particularly preferably 67–130 Pa Microwave (in a case where microwave plasma is used): 0.7–4.5 $W/Cm^2_1$ more preferably 1.4–3.6 $W/cm^2$, particularly preferably 1.4–2.8 $W/cm^2$. (Conditions for hydrogen radical-supplying step)

Inert gas (e.g., krypton, argon, He or Xe): 500–3000 sccm, more preferably 1000–2000 sccm, $N_2$: 10–500 sccm, more preferably 20–100 sccm, Temperature: room temperature (25° C.) to 600° C., more preferably 250–500° C., particularly preferably 250–400° C.

Pressure: 3–400 Pa, more preferably 67–270 Pa, particularly preferably 67–130 Pa Microwave (in a case where microwave plasma is used): 0.7–4.5 $W/cm^2$, more preferably 1.4–3.6 $W/cm^2$, particularly preferably 1.4–2.8 $W/cm^2$.

(Radical-Generating Means)

In the present invention, the radical-generating means is not particularly limited, as long as it may generate the above-mentioned nitrogen radicals and/or hydrogen radicals. I low-temperature processing, it is preferred to use plasma. Among this plasma, in view of electron temperature, plasma density, and uniformity, it is preferred to use the plasma based on microwave power supply, particularly the plasma based on power supply using a plane (or flat-type) antenna member.

(Plane Antenna Member)

In the production process for electronic device material according to the present invention, in view of the formation of plasma having a low electron temperature, a high density, and a high uniformity, it is preferred to irradiate microwave via a plane antenna member having a plurality of slots. In the embodiment using such a plane antenna member, the nitride film is formed by using the plasma having excellent characteristic, and therefore the present invention can provide a process which accomplishes a light plasma damage, and a high reactivity at a low temperature. Further, in this embodiment, as compared with a case using conventional plasma, it is possible to obtain an advantage that a nitride film having a profile wherein the nitrogen content is uniformly high in a plane may easily be provided by irradiating microwave via a plane antenna member.

According to the present inventors investigations and knowledge, it is presumed that the nitridation is conducted by using the high-density plasma having a low electron temperature which has been generated by irradiating microwave via a plane antenna member having a plurality of slots, and accordingly, the dangling bonds in the film are terminated in an ideal sate; and as a result, the insulation characteristic of the film per se can be improved, to thereby provide an electronic device material (for example, semiconductor material) having an excellent characteristic.

(Preferred Plasma)

Preferred plasma characteristics of the plasma which may preferably been used in the present invention are as follows.

Electron temperature: 0.5–2.0 eV

Density: 1E10 to 5E12 $cm^{-3}$

Uniformity in plasma density: ±10% or less (Use of Nitride Film)

In the present invention, a high-quality nitride film Can be formed. Accordingly, it is easy to form a semiconductor device structure having an excellent characteristic by forming another layer (e.g., electrode layer) on this nitride film.

(Suitable Characteristic of Nitride Film)

According to the present invention, a nitride film having the following suitable characteristic can easily be formed.

Gate leakage current: the gate leakage current may be reduced by a factor of 0.5 order (or digit) or more, as compared with that of a conventional thermal oxidation film, Flat band voltage: the shift is 100 μV or less, as compared with that of a conventional thermal oxidation film, Uniformity in electric film thickness: 2% or less (three σ/Ave).

(Preferred use of Semiconductor Structure)

The use of the method according to the present invention is not particularly limited. The high-quality nitride film which can be formed by the present invention may particularly preferably be used as the gate insulator of an MOS structure.

(One Embodiment of Processing Method According to the Present Invention Method)

Figure 3B:
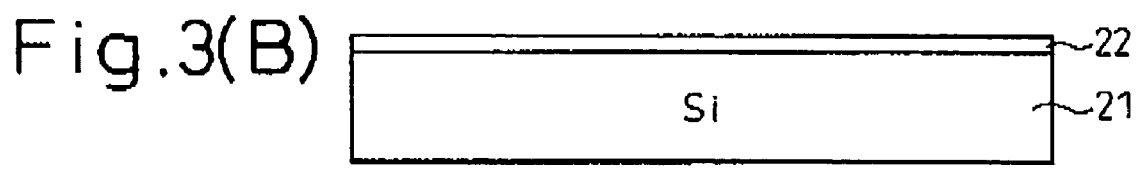
Figure 3C:
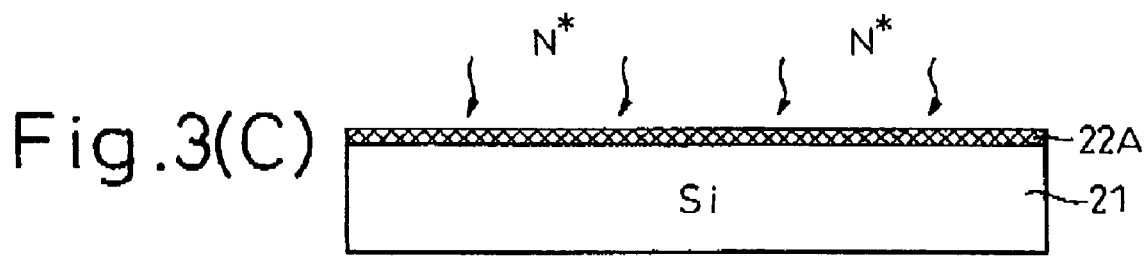

FIG. 3A to 3C are schematic sectional views showing the substrate processing method according to the first embodiment of the present invention which uses the above-mentioned substrate-processing apparatus 10 of FIG. 1.

Referring to FIG. 3A, an electronic device substrate 21 comprising silicon as a substrate W to be processed is introduced into the processing container 11 of the above substrate-processing apparatus 10. A mixture gas comprising krypton and oxygen is introduced into the processing container 11 from the above shower plate 14, and is activated by microwave plasma to produce atomic oxygen O*. The surface of electronic device substrate 21 is processed by such atomic oxygen O*, to thereby form a silicon oxide film 22 having a thickness of 1.6 nm on the surface of the electronic device substrate 21, as shown in FIG. 3B. The thus formed silicon oxide film 22 has a leakage current characteristic comparable to that of a thermal oxidation film which has been formed at a high temperature of 800° C. or more, although the silicon oxide film 22 has been formed at a low temperature of about 400° C. Alternatively, the above silicon oxide film 22 may be a thermal oxidation film.

Next, in the step as shown in FIG. 3C, a mixture gas comprising argon and nitrogen is supplied into the processing container 11 in the substrate-processing apparatus 10 of FIG. 1, the substrate temperature is set to 400° C., and plasma is excited by supplying microwave thereinto.

In the step of FIG. 3C, the internal pressure of the processing container 11 is set to, e.g., 7 Pa, and argon gas at a flow rate of 1000 sccm, and nitrogen gas is supplied, e.g., at a flow rate of 40 sccm. As a result, the surface of the above silicon oxide film 22 is converted into a silicon nitride film 22A.

The step of FIG. 3C is continued for 20 seconds or more (e.g., for 40 seconds), and as a result, the above the silicon nitride film 22A is grown when the growth of the silicon nitride film 22A passes the turnaround point, the oxygen in the silicon oxide film 22 under the silicon nitride film 22A begins to penetrate or invade into the electronic device substrate 21.

Figure 4A:
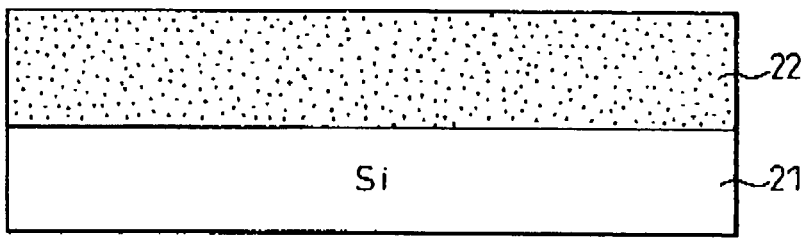
FIGS. 4A to 4C are enlarged schematic sectional views partially showing the substrate processing steps according to the first embodiment of the present invention.
Figure 4B:
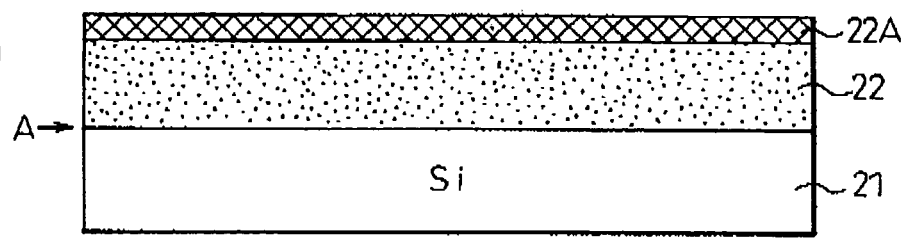
Figure 4C:
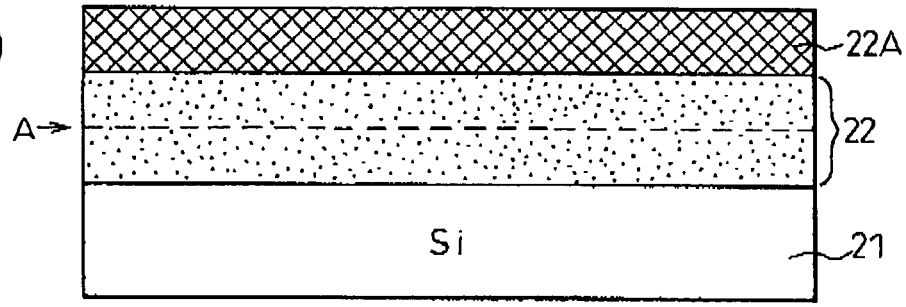

FIGS. 4A to 4C schematically show the states or conditions of the silicon oxide film 22 and the silicon nitride film 22A, before and after the turnaround point.

Referring to FIGS. 4A to 4C, FIG. 4A corresponds to the step of FIG. 3 B, and shows a state wherein the silicon oxide film 22 has been formed on the electronic device substrate 21. FIG. 45 corresponds to an early stage of the step of FIG. 3C, and shows a state wherein the surface of the silicon oxide film 22 is nitrided to thereby form a thin silicon nitride film 22A.

On the other hand, FIG. 4C corresponds to a state of the later stage of the step of FIG. 3C which has passed the turnaround point, and shows a state wherein the oxygen in the silicon oxide film 22 invades into the electronic device substrate 21 along with the growth of the silicon nitride film 22A. This state is apparently similar to a state wherein the silicon oxide film 22 has shifted into the electronic device substrate 21. In FIGS. 4B and 3C, the reference A denotes the boundary surface between the original silicon oxide film 22 and the electronic device substrate 21.

In the state of FIG. 4C, it is naturally considered that a flat and clear boundary surface (e.g., one as shown in FIG. 4B) is not formed between the silicon oxide film 22 and electronic device substrate 21, and a lot of silicon dangling bonds are formed. When such dangling bonds are present, the electric characteristic of the film is changed. Therefore, when a MOS transistor assuming such a state is formed, the threshold voltage of the transistor is changed.

Figure 3D:
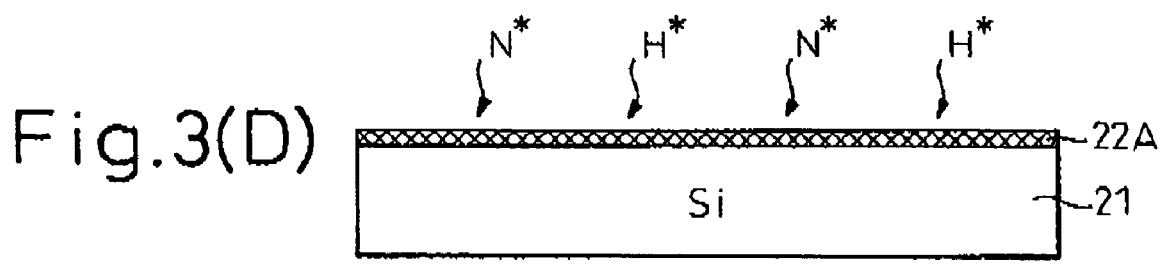

From the above point of view, in the present invention, hydrogen gas (e.g., 20 sccm) is added to the plasma from the above argon gas and nitrogen gas in the step of FIG. 3D, to thereby excite hydrogen radicals H*.

The thus excited hydrogen radicals H* can freely pass through the entire silicon nitride film 22A, unlike normal molecule $H_2$, and they easily arrive at the silicon oxide film 22 under the silicon nitride film 22A, and further arrive at a portion in the vicinity of the interface between the silicon oxide film 22 and the electronic device substrate, to thereby terminate the dangling bonds. As a result, when the hydrogen radical treatment as shown in FIG. 3D is conducted, it is possible to recover the degradation in the characteristic of the silicon oxide film 22, which has been generated by the plasma nitriding treatment beyond the turnaround point.

FIG. 5 shows a relationship between the leakage current characteristic Jg and the effective oxide thickness Teq of the insulating film, which has been obtained by subjecting the silicon oxide film to the nitriding treatment and the hydrogen radical treatment.

Referring to FIG. 5, it is found that the silicon oxide film 22 has a film thickness of 1.7 nm at first, but the effective oxide thickness Teq thereof is decreased to about 1.5 nm by forming the silicon nitride film 22A by use of the above nitriding treatment for 10 seconds. In addition, as shown by a straight line in this figure, the leakage current value Jg is decreased to about a half of the value thereof expected for silicon oxide having a thickness of 1.5 nm. Similarly, it is found that, when the above nitriding is conducted for 20 seconds, the effective oxide thickness Teq of the entire insulating film including the silicon oxide film 22 and the silicon nitride film 22A is further decreased, and further, the leakage current Jg is not increased. On the other hand, it is found that, when the above nitriding is continued for 40 seconds, the effective oxide thickness Teq is further decreased so that the value approaches 1.4 nm. When the nitriding is further continued, the oxygen in the silicon oxide film 22 begins to invade into Si substrate 21, and the total physical film thickness of the silicon oxide film 22 and the silicon nitride film 22A begins to increase along with this phenomenon, as shown by an arrow in FIG. 5, the total effective oxide thickness of the entire films 22 and 22A begins to increase reversely.

Figure 6:
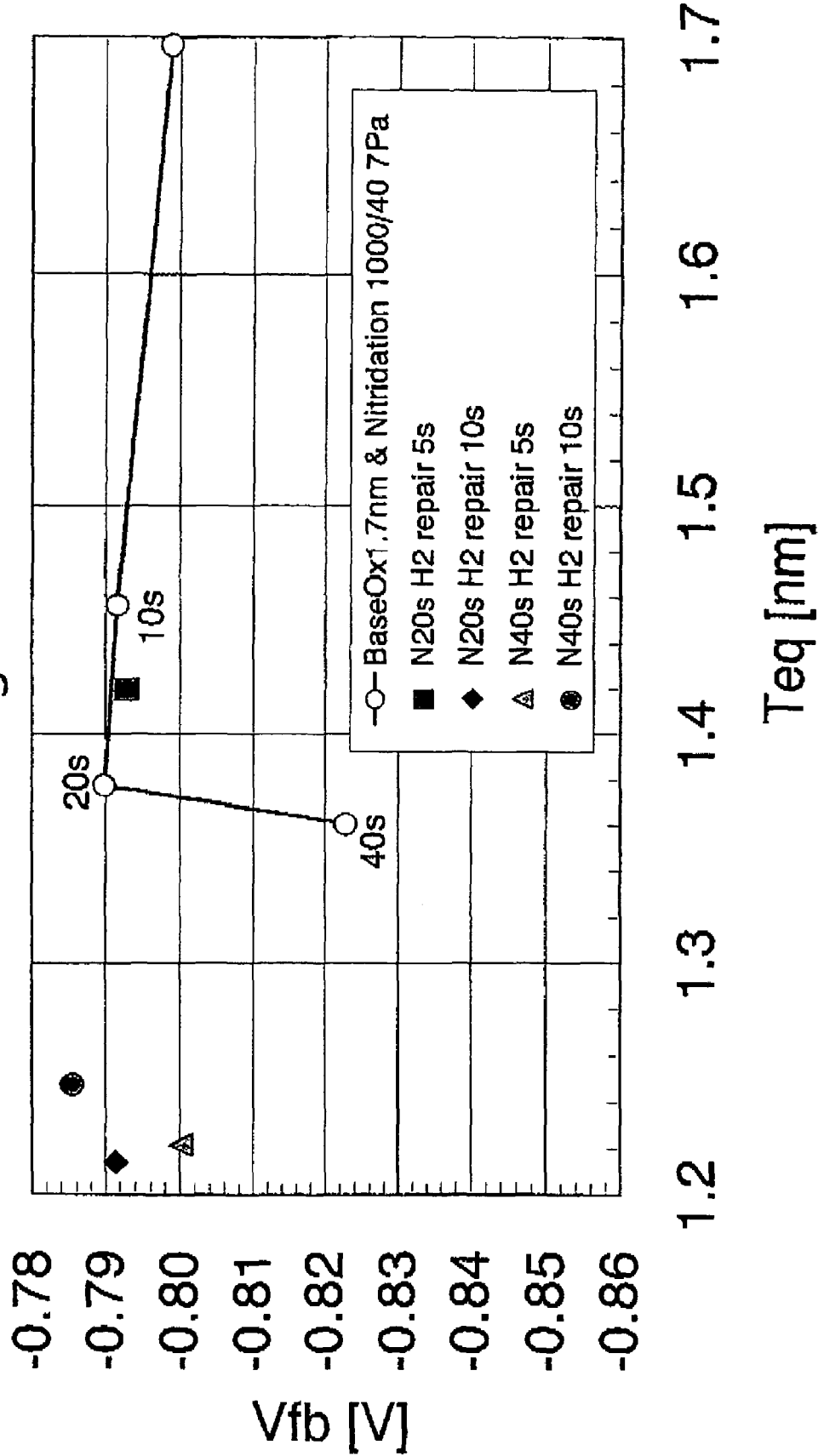
FIG. 6 shows a relationship between the flat band voltage and the effective oxide thickness Teq which has been provided by the first embodiment of the present invention.

On the other hand, referring to the view of FIG. 6 showing a relationship between the flat band voltage and the effective oxide thickness Teq, it is found that the flat band voltage of the MOS structure which has been obtained by forming a poly-silicon gate electrode on the above silicon nitride film 22A, is about −0.79 V and is not substantially changed when the nitriding treatment time in FIG. 3C is 20 seconds or less; but when the nitriding treatment time becomes 40 seconds, the value is rapidly changed to −0.82 V. This is the effect of the turnaround which has been shown in FIG. 4C, and this means that the oxygen in the silicon oxide film 22 begin to invade into the electronic device substrate 21.

In FIG. 6, the symbols ▼ and ● denote the values of the flat band voltage which have been obtained when the hydrogen radical treatment of FIG. 3D ($H_2$ repair) is conducted for 5 seconds and 10 seconds, respectively, on the sample which has been subjected to the above nitriding treatment for 30 seconds beyond the turnaround point. In addition, FIG. 6 also shows the values of the flat band voltage which have been obtained when the hydrogen radical treatment is conducted for 5 seconds and 10 seconds, respectively, on the sample which has beep subjected to the above nitriding treatment for 15 seconds and 10 seconds, which are not beyond the turnaround point .

Referring to FIG. 6, it is found that the flat band voltage is recovered to −0.8 V which is near to the original value of −0.79 V, by subjecting the sample (beyond the turnaround point) to the hydrogen radical treatment. In addition, it is also found that the flat band voltage is not substantially changed, even by subjecting the sample (not beyond the turnaround point) to the hydrogen radical treatment.

Further, as shown in FIG. 5, it is found that when a sample which has passed the turnaround point to a hydrogen radical treatment, the effective oxide thickness is further decreased without causing a change in the leakage current. Herein, the points denoting the respective experiments in FIG. 5 corresponding to those in FIG. 6 are denoted by the same marks as those in FIG. 6.

FIGS. 7A and B show C-V characteristic which has been measured with respect to the thus obtained insulating films.

Referring to FIG. 7B, the state of the flat band voltage recovery by the hydrogen radical treatment is explained. FIG. 7B shows a C-V characteristic (capacity-gate voltage characteristic) of an MOS capacitor, and the gate voltage corresponding to 2.5 pF (flat band capacity: Cfb) in this figure corresponds to the flat band voltage. With respect to the oxide film (BaseOx 1.7 nm) in the a state of FIG. 3B shown by a dotted line in this figure, a shift in the C-V characteristic is not observed, after the nitriding treatment for 20 seconds (1000/40 7 Pa 20 s). However; after the nitriding treatment for 40 seconds (1000/40 7 Pa 40 s), the C-V characteristic is entirely shift to the minus direction. In other words, the shift to the minus direction of the flat band voltage is observed. On the other hand, when a sample is subjected to the nitriding treatment for 40 seconds, and thereafter subjected to the hydrogen radical treatment for 5 seconds (1000/40 7 Pa 40 s →$H_2$ Repair 5 s), the flat band shift which has been observed after the nitriding treatment for 40 seconds is recovered, the value after the recovery approaches the value of C-V characteristic of the oxide film shown in FIG. 3B.

Figure 8A:
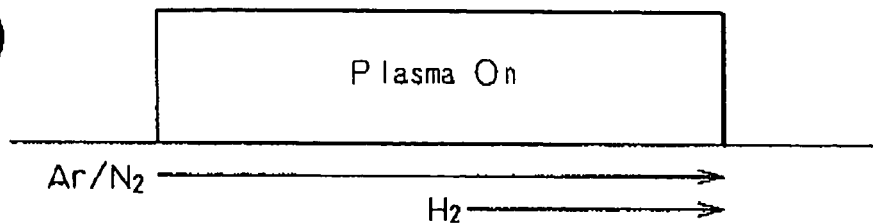
FIG. 8A and 8B are views showing a process sequence of the first embodiment of the present invention.

FIG. 8A show a process sequence which has been used in the first embodiment of the present invention.

Referring to FIG. 8A, in this embodiment, and plasma is first excited in a mixture gas comprising argon and $N_2$, and the resultant product is subjected to the nitriding treatment of FIG. 3C, and thereafter hydrogen gas is added to the reaction system to thereby effect a hydrogen radical treatment.

In this embodiment, the addition of the hydrogen gas at the beginning is avoided, but hydrogen gas is added after the nitriding treatment is substantially completed. As a result, the decrease in the plasma density due to the addition of hydrogen gas is avoided, it is possible to effectively conduct the nitriding treatment.

Figure 8B:
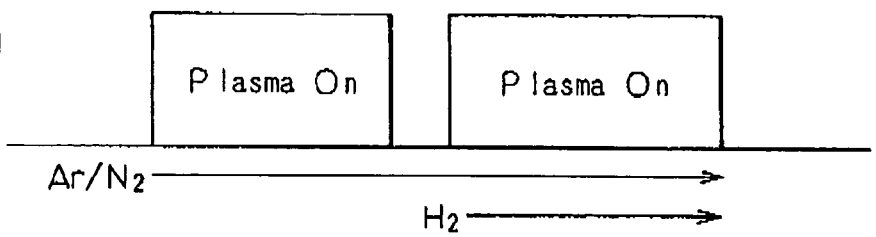

In this embodiment, it is also possible to use a process sequence of FIG. 8B, instead of using the process sequence of FIG. 8A.

In the process sequence of FIG. 8B, after the completion of the nitriding treatment, the supply of microwave is once interrupted, and thereafter plasma is newly formed in a mixture gas comprising argon gas, nitrogen gas, and hydrogen gas so as to conduct a desired hydrogen radical treatment.

(Second Embodiment)

Figure 9A:
FIG. 9A to 9C are views showing the substrate processing steps by the second example of the present invention.
Figure 9B:
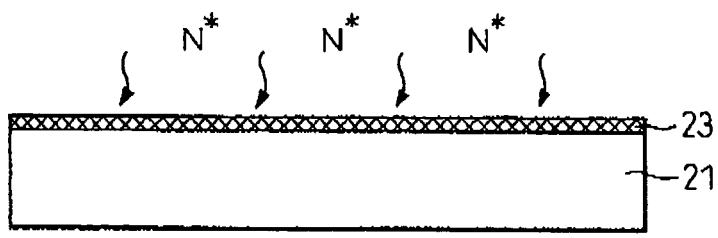
Figure 9C:
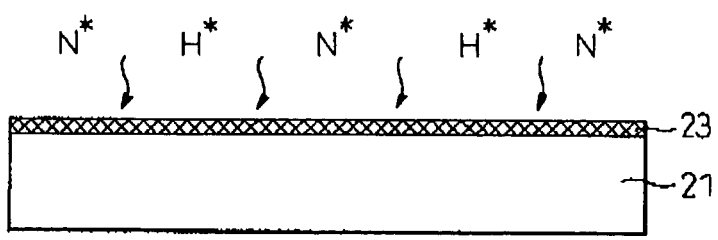

FIGS. 9A to 9C show a substrate processing method according to a second embodiment of the present invention. Herein, in these figures, the same reference numerals denote the portions which have already been explained hereinabove, and the explanation thereof is omitted.

Referring to FIG. 9A, an Si substrate 21 is introduced into the processing container 11 of a substrate-processing apparatus 10 of FIG. 1, and plasma is excited in a mixture gas comprising argon gas and nitrogen gas in the step of FIG. 9B, the surface of the above Si substrate 21 is processed by use of nitrogen radicals N* which have been formed by the plasma excitation. As a result, a silicon nitride film is formed on the surface of the above Si substrate 21.

In this embodiment, in the step of FIG. 9C, hydrogen gas is further introduced into the processing container 11 according to the sequence of FIG. 8A, so that the surface of the substrate 21 is further processed by the excited hydrogen radicals H*.

The thus formed hydrogen radicals H* may easily penetrate or invade into the silicon nitride film 23, unlike hydrogen molecules, and they arrive at the interface between the Si substrate 21 and the silicon nitride film 23, to thereby effectively terminate the dangling bonds in Si.

In this embodiment, it is also possible to realize high-density plasma at the time of the nitridation step of FIG. 9B by plasma-exciting the mixture gas comprising argon gas and nitrogen gas. In this case, not only the film quality of the thus formed nitride film may be improved, but also the throughput of nitriding treatment may be improved.

Hereinbelow, the present invention will be described in more detail with reference to Examples.

EXAMPLE 1

The nitride films which have been subjected to the above-mentioned respective evaluations corresponding to FIGS. 5–7, were manufactured by a method comprising the following steps.

(1) Substrate

As the substrate, a 20 cm (8 inches) P-type silicon substrate was used, and the substrate had a specific resistance of 10 Ωcm, and a plane orientation of (100).

(2) Preliminary Washing Prior to Gate Oxidation

The natural oxide film and contaminating elements (metals, organic matters, particles) were removed by using the RCA-washing by use of a combination of APM (a liquid mixture of ammonia, aqueous hydrogen peroxide, and pure water=1:2:10; 60° C.), HPM (a liquid mixture of hydrochloric acid, aqueous hydrogen peroxide, and pure water=1:1:10; 60° C.) and DHF (a liquid mixture of hydrofluoric acid and pure water=1:100; 23° C.). The RCA-washing was conducted in the sequence of APM (10 min.)→pure water rinse (10 min.)→DHF (3 min.)→pure water rinse (10 min.)→HPM (10 min.)→pure water rinse (10 min.)→pure water final rinse (5 min.), and thereafter IPA (isopropyl alcohol, 220° C.) drying was conducted for 15 min., to thereby dry the water content on the wafer.

(Oxidation Process: Step 2A)

An oxide film (denoted by the reference numeral 22 in FIG. 4A) was formed the silicon substrate which had been subjected to the above treatment (2), in the following manner.

Referring to FIG. 3A, an electronic device substrate 21 comprising silicon as a substrate w to be processed was introduced into the processing container 11 of the substrate-processing apparatus 10 shown in FIG. 1. A mixture gas comprising krypton and oxygen was introduced into the processing container 11 from the above shower plate 14, and was activated by microwave plasma to produce atomic oxygen O*. The surface of electronic device substrate 21 is processed by such atomic oxygen O*, to thereby form a silicon oxide film 22 having a thickness of 1.7 nm on the surface of the electronic device substrate 21, as shown in FIG. 3B. The thus formed silicon oxide film 22 had a leakage current characteristic comparable to that of a thermal oxidation film which had been formed at a high temperature of 800° C. or more, although the silicon oxide film 22 had been formed at a low temperature of about 400° C.

<Processing Conditions>

| Kr gas: | 2000 sccm |
| Oxygen gas: | 200 sccm |
| Temperature: | 400° C. |
| Pressure: | 260 Pa |
| Microwave: | 2.8 W/cm$^2$ |

Processing time: For 1 min.

(Nitridation Step: Step of FIG. 3C)

Next, in the step of FIG. 3C, a nitridation treatment was conducted in the substrate-processing apparatus 10 of FIG. 1 under the following conditions.

<Processing Conditions>

| Argon gas: | 1000 sccm |
| Nitrogen gas: | 40 sccm |
| Substrate temperature: | 400° C. |
| Pressure: | 7 Pa |
| Microwave: | 1.4 W/cm$^2$ |
| Processing time: | 40 seconds |

(Hydrogenation Step: Step 3D)

Next, in the step of FIG. 3D, a hydrogenation treatment was conducted in the substrate-processing apparatus 10 of FIG. 1 under the following conditions.

<Processing Conditions>

| Argon gas: | 1000 sccm |
| Nitrogen gas: | 40 sccm |
| Hydrogen gas: | 20 sccm |
| Substrate temperature: | 400° C. |
| Pressure: | 7 Pa |
| Microwave: | 1.4 W/cm$^2$ |
| Processing time: | 5, 10 seconds |

FIG. 5 shows a relationship between the leakage current characteristic Jg and the effective oxide thickness Teq of the insulating film which had been obtained by subjecting the silicon oxide film to the nitriding treatment and the hydrogen radical treatment. These relationship between the leakage current characteristic Jg and the effective oxide thickness Teq (FIG. 5), the flat band characteristic (FIG. 6), and C-V characteristic (FIG. 7A and FIG. 7B) were obtained by fabricating a device structure and measuring these properties in the following matter.

1: Substrate

As the substrate, a P-type silicon substrate was used, and the substrate had a specific resistance of 8–12 Ωcm, and a plane orientation of (100).

2: Preliminary Washing Prior to Gate Oxidation

The sacrificial oxide film and contaminating elements (metals organic matters, particles) were removed by using the RCA-washing by use of a combination of APM (liquid mixture of ammonia, aqueous hydrogen peroxide, and pure water), HPM (liquid mixture of hydrochloric acid, aqueous hydrogen peroxide, and pure water) and DgF (liquid mixture of hydrofluoric acid and pure water).

3: Plasma Oxidization Process

The silicon substrate which had been subjected to the above preliminary washing prior to gate oxidation in the above step 2 was oxidized by the following method. The silicon substrate which had been subjected to the above treatment of step 2 was transferred into a reaction processing chamber in a vacuum state (back pressure: 1×10E−4 Pa or less), and the substrate was maintained at 400° C. Then, an inert gas(Kr) and oxygen gas were flown onto the substrate at flow rates of 2000 sccm and 200 sccm, respectively, and the pressure was maintained at 270 Pa (2 Torr). Such an atmosphere was irradiated with microwave of 2.8 W/cm$^2$ via a plane antenna member (SPA) having a plurality of slots so as to generate plasma including oxygen and the inert gas, and plasma oxidation was conducted by using the thus generated plasma.

4: Plasma Nitridation Process

The oxide film which had been subjected to the treatment in the above step 4 was nitrided by the following method. Onto the silicon substrate which had been heated to 400° C., an inert gas and nitrogen gas were flown at flow rates of 1000 sccm and 40 sccm, respectively, and the pressure was maintained at 7 Pa (50 mTorr). Such an atmosphere was irradiated with microwave of 1.4 W/cm$^2$ via a plane antenna member (SPA) having a plurality of slots so as to generate plasma including nitrogen and the inert gas, and an oxynitride film (SiON film) was formed on the substrate by using the thus generated plasma.

5: Thin-Film Formation by Hydrogen Plasma and Recovery of Vfb Shift

The oxynitride film which had been subjected to the treatment in the above step 5 was after-treated by using hydrogen plasma in the following manner. Onto the silicon substrate which had been heated to 400° C., an inert gas and oxygen gas were flown at flow rates of 1000 sccm and 20 sccm, respectively, and the pressure was maintained at 7 Pa (50 mTorr). Such an atmosphere was irradiated with microwave of 1.4 W/cm$^2$ via a plane antenna member (SPA) having a plurality of slots so as to generate plasma including hydrogen and the inert gas, and the oxynitride film was subjected to hydrogen plasma treatment by using the thus generated plasma.

6: Film Formation of Posy-silicon for Gate Electrode

A poly-silicon film was formed by a CVD method as a gate electrode on the silicon substrate on which the oxynitride film had been formed in the above steps 1 to 6. The silicon substrate having the oxynitride film formed thereon was heated to 630° C., and a silane gas was introduced onto the substrate at 250 sccm under a pressure of 33 Pa, and this state was maintained for 30 min., to thereby form a poly-silicon film for an electrode having a film thickness of 3000 A on the oxynitride film.

7: Doping of P (Phosphorus) to Poly-silicon

The silicon substrate which had been obtained in the above step 6 was heated to 850° C., and POC13 gas, oxygen and nitrogen were introduced onto the substrate at normal pressure at 350 sccm, 200 sccm, and 20000 sccm, respectively, and this state was maintained for 24 min., to thereby dope the inside of the poly-silicon with phosphorus.

8: Patterning, Gate Etching

The silicon substrate which had been obtained in the above step 7 was subjected to patterning by lithography, and the silicon substrate was immersed in a liquid chemical having a ratio of HF:HNO$_3$:H$_2$O=1:60:60 for three minutes so as to dissolve a portion of the poly-silicon which had not been subjected to the patterning, to thereby fabricate an MOS capacitor.

<Method of Evaluating C-V Characteristic>

The C-V Characteristic was measured and analyzed in by the following. At first, the characteristics of a capacitor having a gate electrode area of 2500 μm$^2$ were evaluated at 100 KHz and 250 KHz, respectively, in terms of C-V and D-V (D: loss factor). Then, there was analyzed the C-V characteristic of the insulating film per se from which the parasitic capacitance attributable to the measurement circuit, etc., was removed by using a two-frequency measuring method (SSDM 2000 Extended Abstracts, pp.452–453, A Guideline for Accurate Two-Frequency capacitance Measurement for Ultra-Thin Gate Oxides, Akiko Nara et.al.). More specifically, the two-frequency measuring method was conducted in the following manner. At first, by using respective frequencies of 100 KHz and 250 KHz, the gate voltage was scanned from +0.5 V to −2.1 V, to thereby evaluate the capacitance (C: capacity) and dissipation (D: loss factor) at each voltage. HP 4284A apparatus was used as a C-V meter, and a Parallel mode was used as the measurement mode. The steps of the voltage were 20 mV, and the measurement temperature was room temperature. From the thus obtained values of C and D, the capacity of the insulating film itself from which the parasitic capacitance attributable to the measurement circuit, etc., was removed, was calculated with respect to each of the above values of the gate voltage by using the formula corresponding to the two-frequency analysis the thus obtained values were used as the C-V characteristic of this MOS structure. FIG. 7($a$) and FIG. 7($b$) show the C-V characteristics which had been analyzed by the above measuring method. FIG. 7($a$) shows the values corresponding to the gate voltages from +0.5 V to −2.1 V, and FIG. 7($b$) shows the values corresponding to the gate voltages from −0.6 V to −1.0 V.

<Method of Analyzing Flat Band Characteristic>

Based on the fact that substrate concentration was 1E15/cm$^3$, and the electrode area was 2500 μm$^2$, the flat band capacity was calculated as 2.5 pF. Accordingly, the gate voltage value at 2.5 pF was defined as the flat band voltage here. From FIG. 7($b$), it was fond that the flat band voltage of the oxide film in this structure became about −0.8 V.

<Method of Evaluating Effective Oxide Thickness Teq>

From the thus obtained flat band value, the effective oxide thickness was obtained from the capacity value in the 0.6 V minus voltage side by using the following method. When the flat band voltage is −0.8 V, the capacity value in the 0.6 V minus voltage side becomes a capacity value at the gate voltage of 0.8−0.6=−1.4 V. The relationship between the capacity and the effective oxide thickness is as follows:

(Capacity)=(vacuum dielectric constant)(dielectric constant of oxide film 3.9)×(capacitor area)÷ (effective electric film thickness: Teff)   (Formula 1)

(Effective oxide thickness: Teq)=1.0655×Teff−1.2923 (the unit of both of Teq and Teff is nm)   (Formula 2)

Formula 1 is a formula capacity based on fundamentals of physics.

Formula 2 is an empirical formula which has been derived from the relationship between the ellipsometric film thickness and Teff. It is possible to convert the value of Teff into the value of the ellipsometric film thickness by using Formula 2.

Teff was obtained by substituting the capacity value at the gate voltage of −1.4 V in Formula 1, and the effective oxide thickness Teq was obtained by substituting the thus obtained Teff value in Formula 2.

(Method of Measuring I-V Characteristic>

The I-V characteristic was determined by scanning the gate voltage from 0 V to −2.4 V in the MOS capacitor having a gate electrode area of 2500 μm, and evaluating the current value (leakage current value) flowing at each of the voltages. The evaluation was conducted by using HP-4071 Parametric Tester, and voltage steps of 20 mV.

The measurement was conducted at room temperature.

<Method of Evaluating Leakage Current Characteristic Jg>

In order to evaluate the leakage characteristic of this MOS capacitor, the leakage current value at the gate voltage which had shifted from the above-obtained flat band value to 0.4 V minus direction, was determined from the I-V characteristic. When the flat band voltage was −0.8 V, the leakage current at the gate voltage of −0.8−0.4=−1.2 V was used for the purpose of evaluating the leakage characteristic.

INDUSTRIAL APPLICABILITY

As described hereinabove, according to the present invention, an electronic device substrate is subjected to a nitriding treatment and a hydrogen radical treatment, whereby a defect such as dangling bonds in a nitride film to be formed can be obviated.

Particularly, in the present invention, even when a nitride film is formed beyond the turnabout point, the problem encountered in the use of such a nitride film can be solved by conducting a hydrogen radical treatment. As a result, for example, it is possible to restore a change in the flat band voltage and the threshold voltage of an MOS transistor.

Accordingly, the present invention can provide a nitride film which not only has a very thin effective oxide thickness, but also provides and an electric characteristic which is comparable to that of an oxide film, with respect to the flat band voltage and the threshold voltage.

The invention claimed is:

1. A method of processing a substrate for an electronic device, comprising, at least:
   disposing the electronic device substrate in a chamber;
   a nitridation step (a) nitriding surface of the electronic device substrate to form a nitride film by supplying nitrogen radicals on the surface thereof in the chamber; and
   a hydrogenation step (b) of supplying a process as into the chamber and generating plasma based on the process gas so as to generate hydrogen radicals in the chamber, to thereby hydrogenate the nitride film with the hydrogen radicals in the chamber.

2. A method of processing an electronic device substrate according to claim 1, wherein the hydrogenation step (b) is performed after the nitridation step (a).

3. A method of processing an electronic device substrate according to claim 1, wherein the nitridation step (a) and the hydrogenation step (b) are performed partially in parallel.

4. A method of processing an electronic device substrate according to claim 1, wherein hydrogen radicals are supplied in the nitridation step (a) or nitrogen radicals are supplied in the hydrogenation step (b).

5. A method of processing an electronic device substrate according to claim 1, wherein the electronic device substrate is a substrate for a semiconductor device.

6. A method of processing an electronic device substrate according to claim 5, wherein the electronic device substrate is a substrate comprising silicon as a main component.

7. A method of processing an electronic device substrate according to claim 1, wherein the electronic device substrate is a substrate for a liquid crystal device.

8. A method of processing an electronic device substrate according to claim 1, wherein the surface of the electronic device substrate is the surface of an oxide film.

9. A method of processing an electronic device substrate according to claim 1, wherein the nitrogen radicals are formed by the plasma in a mixture gas of an inert gas and nitrogen gas.

10. A method of processing an electronic device substrate according to claim 9, wherein the plasma is excited by microwave.

11. A method of processing an electronic device substrate according to claim 9, wherein the hydrogenation step is performed by further adding hydrogen gas to the plasma in the mixture gas of an inert gas and nitrogen gas.

12. A method of processing an electronic device substrate according to claim 9, wherein the plasma excitation is stopped after the nitridation step, and the hydrogenation step (b) is performed by again exciting plasma in a mixture gas of an inert gas, nitrogen gas, and hydrogen gas.

13. An electronic device material comprising a substrate for an electronic device, and having a nitride film on at least a part of the surface of the electronic device substrate;
   wherein the electronic device material provides a shift in the flat band voltage (Vfb) of 0.1 V or less in the case of NMOS, and a shift in the flat band voltage (Vfb) of 1 V or less in the case of PMOS, as compared with the flat band voltage of an oxide film, provided that the electronic device material is used as an insulating layer constituting an MOS type device structure.

14. An electronic device material according to claim 13, wherein the electronic device substrate is one for a semiconductor.

15. An electronic device material according to claim 13, wherein the electronic device substrate is one for a liquid crystal device.

16. An electronic device material according to claim 13, wherein the electronic device substrate is a substrate comprising silicon as a main component.

17. An electronic device material according to claim 13, wherein the nitride film has been provided by nitriding the electronic device substrate.

18. An electronic device material according to claim 13, wherein the nitride film has been provided by nitriding an oxide film on the electronic device substrate.

19. A method of forming a nitride film on a substrate for an electronic device, comprising:
   (a) disposing the substrate in a processing chamber;
   (b) supplying a nitrogen-containing gas into the processing chamber;
   (c) generating nitrogen radicals in the processing chamber, and exciting the nitrogen-containing gas with plasma;
   (d) forming a nitride film by nitriding a surface of the substrate with the nitrogen radicals;

(e) supplying a hydrogen-containing gas into the processing chamber;

(f) generating hydrogen radicals by supplying a process gas into the chamber and generating plasma based on the process gas; and hydrogenating the nitride film.

20. A method of processing an electronic device substrate according to claim 19, wherein the plasma is excited by microwave.

21. A method of processing an electronic device substrate according to claim 19, wherein the nitrogen-containing gas and the hydrogen-containing gas contain an inert gas.

22. A method of processing an electronic device substrate according to claim 21, wherein the inert gas is selected from the group consisting of Ar, Kr, He, and Xe.

23. A method of processing an electronic device substrate according to claim 19, wherein the nitrogen-containing gas is selected from $NH_3$ and $N_2$.

24. A method of processing an electronic device substrate according to claim 19, wherein the nitrogen-containing gas comprises Ar gas and $N_2$ gas.

25. A method of processing an electronic device substrate according to claim 19, wherein at least one of generating the nitrogen radicals and generating the hydrogen radicals is conducted at room temperature to 600° C.

26. A method of processing an electronic device substrate according to claim 19, wherein at least one of generating the nitrogen radicals and generating the hydrogen radicals is conducted at a pressure of 3–400 Pa.

27. A method of processing an electronic device substrate according to claim 19, wherein the plasma is generated by using a plane antenna member.

28. A method of processing an electronic device substrate according to claim 19, wherein a supply of the hydrogen radicals is also generated by adding hydrogen gas to the nitrogen-containing gas.

29. A method of processing an electronic device substrate according to claim 19, wherein the nitrogen radicals and the hydrogen radicals are generated sequentially.

30. A method of processing an electronic device substrate according to claim 19, wherein the nitride film is formed, generation of the nitrogen radicals is stopped, and then generation of the hydrogen radicals is conducted.

31. A method of processing an electronic device according to claim 19, wherein the substrate comprises a substrate containing silicon.

32. A method of processing an insulating film on a substrate with plasma, comprising:

(a) providing the substrate having the insulating film;

(b) generating nitrogen radicals on the substrate by exciting a gas comprising an inert gas and a nitrogen-containing gas with plasma;

(c) forming a nitride film into a surface of the substrate by nitriding the surface of the insulating film with the nitrogen radicals;

(d) supplying a process gas into a chamber and generating plasma based on the process gas so as to generate hydrogen radicals in the chamber; and (e) hydrogenating the surface of the nitride film with the hydrogen radicals.

33. A method of processing an insulating film according to claim 32, wherein the insulating film comprises a silicon oxide film.

34. A method of processing an insulating film according to claim 33, wherein the silicon oxide film is formed by using heat or plasma.

35. A method of processing an insulating film according to claim 32, wherein the hydrogen-containing gas comprises an inert gas and hydrogen gas.

36. A method of processing an insulating film according to claim 32, wherein the nitrogen-containing gas is selected from $NH_3$ and $N_2$.

37. A method of processing an insulating film according to claim 32 or 35, wherein the inert gas is selected from the group consisting of Ar, Kr, He, and Xe.

38. A method of processing an insulating film according to claim 32, wherein the steps of (b) generating nitrogen radicals on the substrate, (c) forming a nitride film on the substrate, (d) generating hydrogen radicals on the nitride film, and (e) hydrogenating the surface of the nitride film with the hydrogen radicals are performed in the presence of plasma.

39. A method of processing an insulating film according to claim 38, wherein the steps of (d) generating hydrogen radicals on the nitride film and (e) hydrogenating the surface of the nitride film are performed after the formation of the nitride film, and after the stoppage of the plasma.

40. A method of processing an insulating film according to claim 32, wherein the steps of (c) forming a nitride film on the substrate and (d) generating hydrogen radicals on the nitride film are performed in the presence of the inert gas and nitrogen-containing gas.

41. A method of processing an insulating film according to claim 32, wherein the plasma is generated by microwaves.

42. A method of processing an insulating film according to claim 41, wherein the plasma is generated by using a plane antenna.

43. A method of forming a silicon nitride film on a silicon substrate with plasma, comprising:

(a) providing the silicon substrate;

(b) generating nitrogen radicals on the silicon substrate by exciting a gas comprising an inert gas and a nitrogen-containing gas with plasma;

(c) forming a silicon nitride film into a surface of the silicon substrate by nitriding the surface of the silicon substrate with the nitrogen radicals;

(d) supplying a process gas into a chamber and generating plasma based on the process gas so as to generate hydrogen radicals in the chamber; and (e) hydrogenating the surface of the silicon nitride film with the hydrogen radicals.

44. A method of forming a silicon nitride film according to claim 43, wherein the nitrogen-containing gas is selected from $NH_3$ and $N_2$, and the hydrogen-containing gas is hydrogen gas.

45. A method of forming a silicon nitride film according to claim 43 or 44, wherein the inert gas is selected from the group consisting of Ar, Kr, He, and Xe.

46. A method of forming a silicon nitride film according to claim 45, wherein the steps of (b) generating nitrogen radicals on the silicon substrate, (c) forming a silicon nitride film on the silicon substrate, (d) generating hydrogen radicals on the silicon nitride film, and (e) hydrogenating the surface of the silicon nitride film are performed in the presence of plasma.

47. A method of forming a silicon nitride film according to claim 46, wherein the steps of (d) generating hydrogen radicals on the silicon nitride film, and (e) hydrogenating the surface of the silicon nitride film are performed after the formation of the nitride film and after stoppage of the plasma.

48. A method of forming a silicon nitride film according to claim 43, wherein the steps of (c) forming a silicon nitride film on the silicon substrate, (d) generating hydrogen radicals on the silicon nitride film are performed in the presence of the inert gas and nitrogen-containing gas.

49. A method of forming a silicon nitride film according to claim 43, wherein the plasma is generated by microwaves.

50. A method of forming a silicon nitride film according to claim 43, wherein the plasma is generated by using a plane antenna.

51. A method of forming a silicon nitride film according to claim 43, wherein the silicon nitride film is a gate insulator.

* * * * *